United States Patent
Briggs et al.

(10) Patent No.: US 10,127,331 B2
(45) Date of Patent: Nov. 13, 2018

(54) 3D MODELS UTILIZING 3D MARKERS TO INDICATE ENGINEERING REQUIREMENTS

(71) Applicant: The Boeing Company, Chicago, IL (US)

(72) Inventors: David D. Briggs, Maple Valley, WA (US); Lloyd James Milton, Mukilteo, WA (US); Andrew Allen Kevin Austill, Renton, WA (US); Anthony Robert Davies, Everett, WA (US); Gregory Dean Lane, Maple Valley, WA (US)

(73) Assignee: THE BOEING COMPANY, Chicago, IL (US)

( * ) Notice: Subject to any disclaimer, the term of this patent is extended or adjusted under 35 U.S.C. 154(b) by 0 days.

(21) Appl. No.: 14/569,883

(22) Filed: Dec. 15, 2014

(65) Prior Publication Data

US 2016/0171124 A1    Jun. 16, 2016

(51) Int. Cl.
| | | |
|---|---|---|
| G06T 19/00 | (2011.01) | |
| G06F 3/0484 | (2013.01) | |
| G06F 17/24 | (2006.01) | |
| G06F 17/50 | (2006.01) | |

(52) U.S. Cl.
CPC ............. *G06F 17/50* (2013.01); *G06T 19/00* (2013.01); *G06T 2219/004* (2013.01)

(58) Field of Classification Search
CPC .. G06F 3/04815; G06F 3/04845; G06F 17/50; G06T 2219/004; G06T 19/00; G06T 19/006; G09G 2340/0492
USPC ....... 345/619, 629, 632–633, 636, 649, 653, 345/664, 420; 715/230, 232–233; 703/1–4, 13–14
See application file for complete search history.

(56) References Cited

U.S. PATENT DOCUMENTS

| | | | | |
|---|---|---|---|---|
| 5,845,288 A | * | 12/1998 | Syeda-Mahmood | ........................ G06F 17/30253 |
| 6,134,338 A | * | 10/2000 | Solberg | .............. G06K 9/00476 382/113 |
| 6,904,392 B1 | * | 6/2005 | Marty | ..................... G06T 19/00 345/651 |
| 7,589,747 B2 | * | 9/2009 | Matsui | .................. G06T 19/006 345/629 |

(Continued)

FOREIGN PATENT DOCUMENTS

EP       2348432 A2      7/2011

OTHER PUBLICATIONS

European Patent Application No. 15199424.1; Extended Search Report; dated May 19, 2016; 7 pages.

(Continued)

*Primary Examiner* — Chante Harrison
(74) *Attorney, Agent, or Firm* — Gates & Cooper LLP (57) ABSTRACT

Methods, devices, and systems are used for three-dimensional models for three-dimensional makers to indicate engineering requirements. In an example, operations may be effectuated that include displaying a graphical user interface including an object in a three-dimensional (3D) space and receiving first data that includes a link between a flag and a component of the object. The flag may be indicative of an engineering requirement associated with the component of the object. The flag in the 3D space approximate to the component of the object may be displayed based on the received data.

20 Claims, 4 Drawing Sheets

(56) References Cited

U.S. PATENT DOCUMENTS

| | | | | |
|---|---|---|---|---|
| 8,314,790 | B1* | 11/2012 | Zeiger | G06T 13/00 345/419 |
| 8,749,588 | B2 | 6/2014 | Herman et al. | |
| 8,860,717 | B1* | 10/2014 | Zeiger | G06T 13/00 345/419 |
| 2002/0118229 | A1* | 8/2002 | Batori | G06T 19/00 715/771 |
| 2003/0229441 | A1* | 12/2003 | Pechatnikov | G01C 21/26 701/411 |
| 2006/0061595 | A1* | 3/2006 | Goede | G06F 17/241 345/619 |
| 2007/0013709 | A1* | 1/2007 | Charles | G06F 17/50 345/581 |
| 2007/0240049 | A1* | 10/2007 | Rogerson | G06T 19/20 715/964 |
| 2008/0180460 | A1* | 7/2008 | Ford | G06F 17/50 345/649 |
| 2008/0235628 | A1* | 9/2008 | Faught | G06F 3/04815 715/848 |
| 2010/0201684 | A1* | 8/2010 | Yadav | G06F 17/50 715/764 |
| 2010/0245344 | A1 | 9/2010 | Chen et al. | |
| 2010/0315417 | A1* | 12/2010 | Cho | G06F 1/1616 345/419 |
| 2011/0063328 | A1* | 3/2011 | Herman | G06T 19/00 345/681 |
| 2012/0159391 | A1* | 6/2012 | Berry | A61B 5/4824 715/823 |
| 2012/0245841 | A1* | 9/2012 | Spindler | G01C 21/32 701/428 |
| 2012/0316840 | A1* | 12/2012 | Dayde | G06F 17/509 703/1 |
| 2013/0226529 | A1* | 8/2013 | Santiquet | G06F 17/50 703/1 |
| 2013/0249906 | A1* | 9/2013 | Gunderson | G06T 15/20 345/420 |
| 2013/0301953 | A1* | 11/2013 | Montague | G06F 3/0481 345/619 |
| 2013/0326426 | A1* | 12/2013 | Queric | G06F 3/04815 715/851 |
| 2014/0047313 | A1* | 2/2014 | Patterson | G06T 15/10 715/230 |
| 2014/0129990 | A1* | 5/2014 | Xin | G06K 9/6201 715/849 |
| 2015/0130807 | A1* | 5/2015 | Kunen | G06T 19/20 345/427 |
| 2015/0347366 | A1* | 12/2015 | Irwin | G06F 17/241 715/231 |
| 2016/0117438 | A1* | 4/2016 | Witzel | G06F 17/50 703/1 |

OTHER PUBLICATIONS

"Commenting on 3D designs in PDFs", as downloaded from https://helpx.adobe.com/acrobat/using/commenting-3d-designs-pdfs-html#commenting_on_3d_designs_in_pdfs, Apr. 4, 2018, pp. 1-6.

"Adobe Acrobat version history", Wikipedia, as downloaded from https://en.wikipedia.org/wiki/Adobe_Acrobat_version_history, Apr. 4, 2018, pp. 1-13.

* cited by examiner

3D MODELS UTILIZING 3D MARKERS TO INDICATE ENGINEERING REQUIREMENTS

BACKGROUND

Engineering drawings are typically used as visual tools in the creation of homes, bridges, airplanes, and other structures. It is common in the field of manufacturing to make use of an electronic repository of design data such as computer aided design (CAD) software packages to generate a view of structures. These drawings can be challenging to read and update, even for individuals who are skilled in the field of engineering or architecture.

SUMMARY

Disclosed are methods, devices, and systems for 3D models utilizing 3D markers to indicate engineering requirements. For example, there may be a method that includes displaying a graphical user interface including an object in a three-dimensional (3D) space and receiving first data that includes a link between a flag and a component of the object. The flag may be indicative of an engineering requirement associated with the component of the object. The flag in the 3D space approximate to the component of the object may be displayed based on the received data.

In another example, there may be a system that includes a display, a processor communicatively connected with the display, and a memory coupled with the processor. The memory may have stored thereon executable instructions that when executed by the processor cause the processor to effectuate operations that include providing instructions to display a graphical user interface including an object in a 3D space; receiving first data, the first data comprising a link between a flag and a component of the object, the flag indicative of an engineering requirement associated with the component of the object; and responsive to receiving the first data, providing instructions to display the flag in the 3D space approximate to the component of the object.

In another example, there may be a device that includes a processor and a memory coupled with the processor. The memory may have stored thereon executable instructions that when executed by the processor cause the processor to effectuate operations that include providing instructions to display a graphical user interface including an object in a 3D space; receiving first data, the first data comprising a link between a flag and a component of the object, the flag indicative of an engineering requirement associated with the component of the object; and responsive to receiving the first data, providing instructions to display the flag in the 3D space approximate to the component of the object.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

DETAILED DESCRIPTION OF ILLUSTRATIVE EXAMPLES

Disclosed herein are methods, devices, and systems for 3D models utilizing 3D markers to indicate engineering requirements. Conventionally, engineering drawings are made in a CAD system in an initial 3D format. The 3D engineering drawing is then put into a two-dimensional (2D) format for a 2D drawing tool. In other words, a snapshot is taken of the 3D CAD drawing and then annotations, callouts, and the like are manually put in the engineering drawing by the 2D drawing tool. Conventionally, someone manually picks a view and then decides what 2D view of an area will be shown. It usually takes several blown up views to show an area, each describing certain sections. If a view is not the "right" view, then there may be excessive time (e.g., several hours) and expense used in finding and creating a better view. As discussed in more detail herein, after a 3D design is created in a CAD-like tool, a flag (e.g., annotation) is added and updated in an automated way into a 3D portable document format (PDF). The use of the 3D PDF may assist in lowering the barrier for delivering 3D data.

Examples in this disclosure provide computer implemented display of information in a three-dimensional (3D) engineering drawing. As used herein, the term engineering drawing includes any drawing created with the aid of a computer, such as by a computer-aided design (CAD) program or other drafting or drawing program, hereinafter referred to as a drafting application. Such engineering drawings may be created for products or structures and are often used to aid in the creation, simulation, planning, construction, maintenance, manufacturing, management, or other aspect of interaction with the product or structure. A structure includes any man-made body such as for example, and not limitation, an airplane, a building, a bridge, a tunnel, a monument, or a dam. Engineering drawings also include survey layouts and maps created with the aid of a computer and that might indicate topography of a site, and locations of natural and man-made features, among a variety of other data elements.

Computer software applications are known in the art for generating engineering drawings. Applications include CAD programs such as AutoCad® from Autodesk® of Mill Valley, Calif., Microstation® from Bentley Systems, Inc. of Exton, Pa., or SolidWorks® from Dassault Systems S.A. of Concord, Mass., among a variety of others.

Engineering drawings can be created with either a two-dimensional or three-dimensional drawing space and utilize any available graphics technology such as raster graphics or vector graphics, among others. In some applications, two-dimensional engineering drawings can be rendered in three dimensions, surfaces can be rendered, drawings can be animated, and the engineering drawing can be manipulated in a three-dimensional drawing space.

Engineering drawings, as discussed herein, may include flags (e.g., markers) associated with a specific portion of the drawing, or with a specific component represented in the drawing. The drawings created in the drawing space are hereinafter referred to as objects. The flags are displayed with the objects in the engineering drawing to provide information about the engineering drawing or the illustrated components therein. The flags include annotations, notes, callouts, or other engineering information. The flags can describe the drawing or the specific product or structure represented therein. The flags might also include audio, video, or image files that portray or provide additional information to the drawing, such as engineering requirements. For example, a flag may include dimensions of a component in the drawing, include text that indicates a wire should be clamped at a particular point of an object, or include audio media or video media that provides a recorded observation for the flagged portion of the drawing. The flag can be automatically generated by a drafting application.

Figure 1:
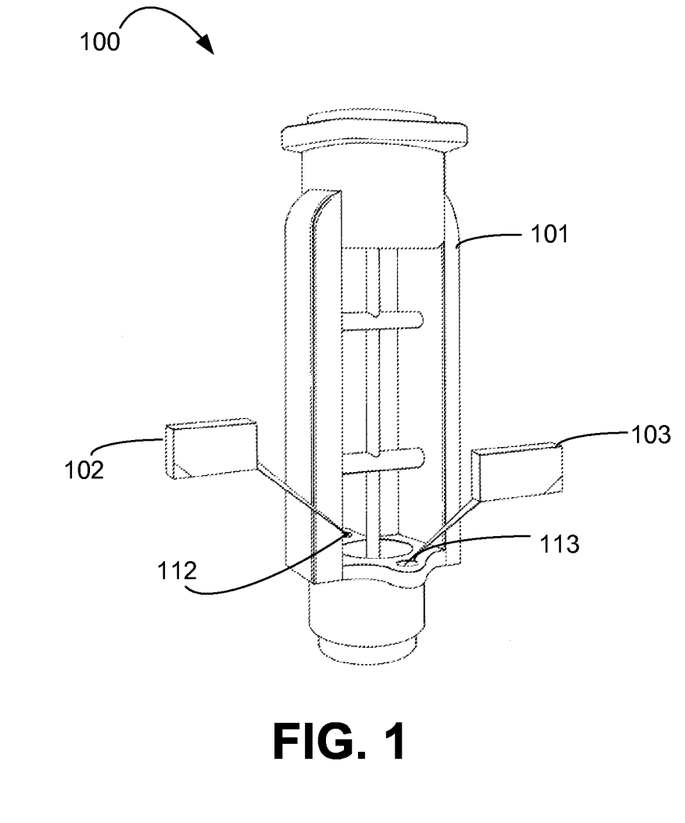
FIG. 1 illustrates an exemplary engineering drawing that includes a plurality of flags associated with engineering requirements.
Figure 2:
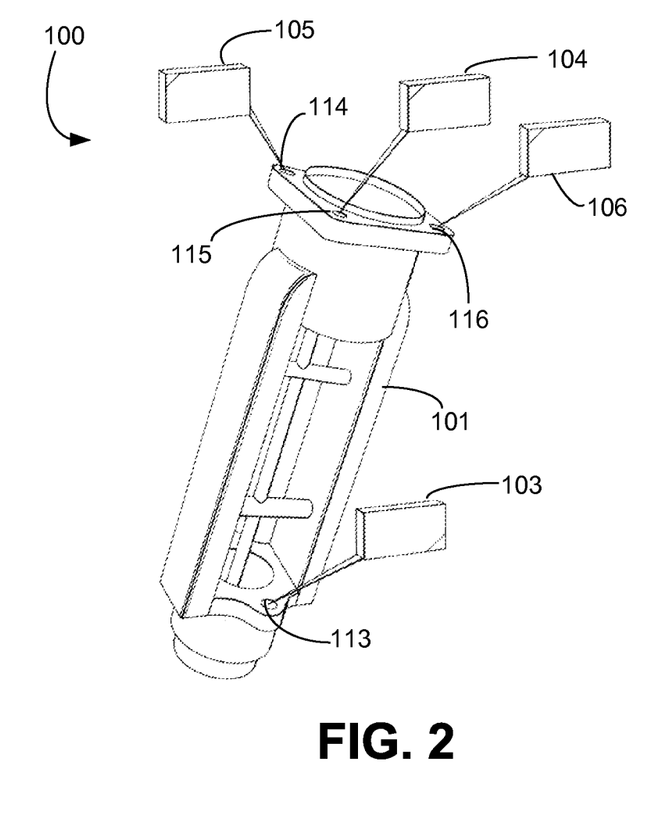
FIG. 2 illustrates an exemplary engineering drawing that includes a plurality of flags associated with engineering requirements.

FIG. 1 through FIG. 2 illustrate an exemplary engineering drawing 100 of different views of an interactive 3D model of object 101. FIG. 1 through FIG. 2 may be shown on a display of a computing device, such as a laptop or a tablet computer. In FIG. 1, flag 102 and flag 103 respectively refer to component 112 and component 113. Flag 102 and flag 103 may be visible in display because their respective component 112 and component 113 are displayed. FIG. 2 illustrates an exemplary changed orientation of the engineering drawing 100 of FIG. 1 with the location or orientation of the flags shifted as well. As described previously, the engineering drawing 100 may be generated or rendered in a three-dimensional drawing space. Object 101 may be rotated about one or more axis so as to view the engineering drawing 100 from a different perspective as depicted in FIG. 2, as opposed to the more broad, perspective depicted in FIG. 1.

Components and respective flags may be shown or hidden based on the perspective of the drawing, as shown by a comparison of FIG. 1 to FIG. 2. In FIG. 2, component 113, component 114, component 115, and component 116 are shown and therefore (in this example) respective three-dimensional (3D) flags 103, 104, 105 and 106 are also shown. Component 112 is no longer shown in FIG. 2 and therefore flag 102 is not shown. As discussed herein, a flag may be used to relay engineering information about a drawing or a component of the drawing, such as how wires should be run through or around components. Each flag may be linked with a respective component. FIG. 1 through FIG. 2 may include any flag as described herein, such as annotations, notes, callouts, shortcuts, audio files, video files, and image files. Any number of flags can be generated for engineering drawing 100.

Figure 3:
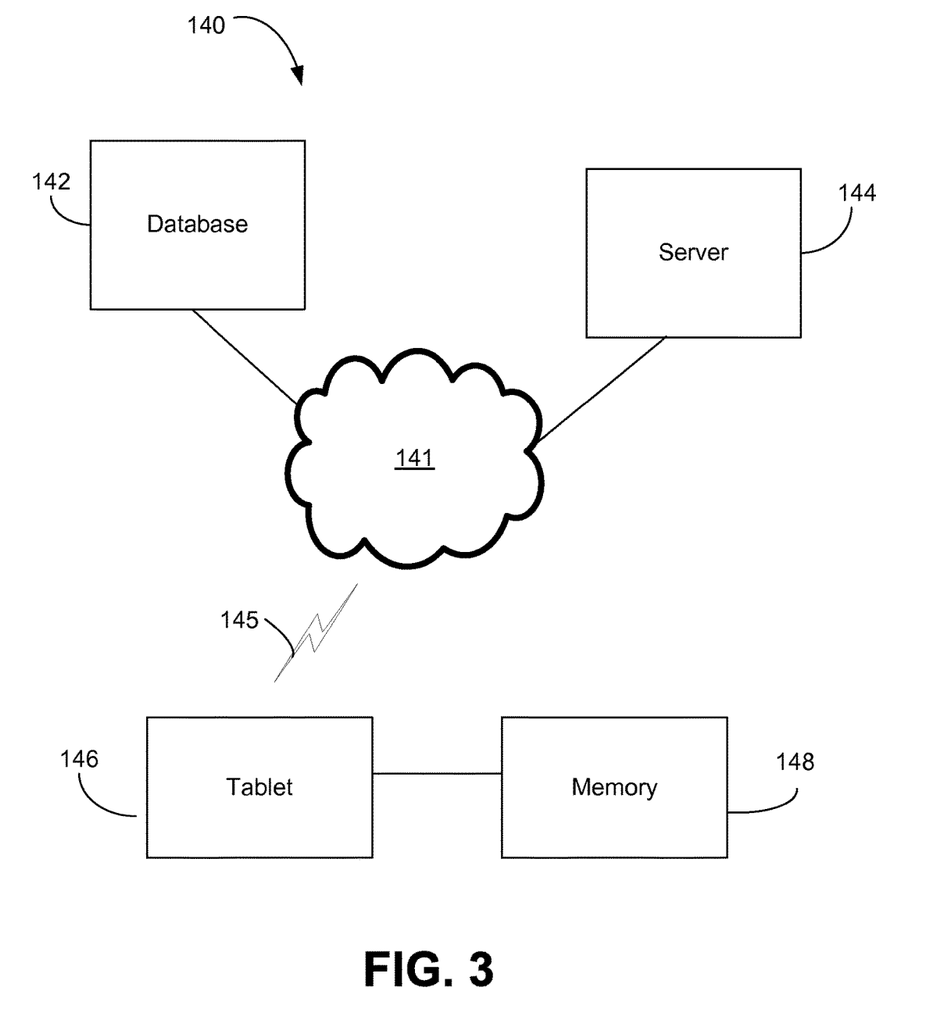
FIG. 3 illustrates an exemplary communication system for interactive 3D models.

FIG. 3 illustrates an exemplary communication system 140 for interactive 3D models, as discussed herein. Database 142, server 144, and tablet 146 may be communicatively connected to each other via network 141. Database 142 may include data such as engineering requirements information and engineering drawings, among other things. Server 144 may process data from database 142 that is associated with engineering requirements information and engineering drawings. Tablet 146 may display engineering drawing 100 by connecting to database 142, server 144, or an attached memory 148. It is assumed that tablet 146 has a display with a graphical user interface.

Figure 4:
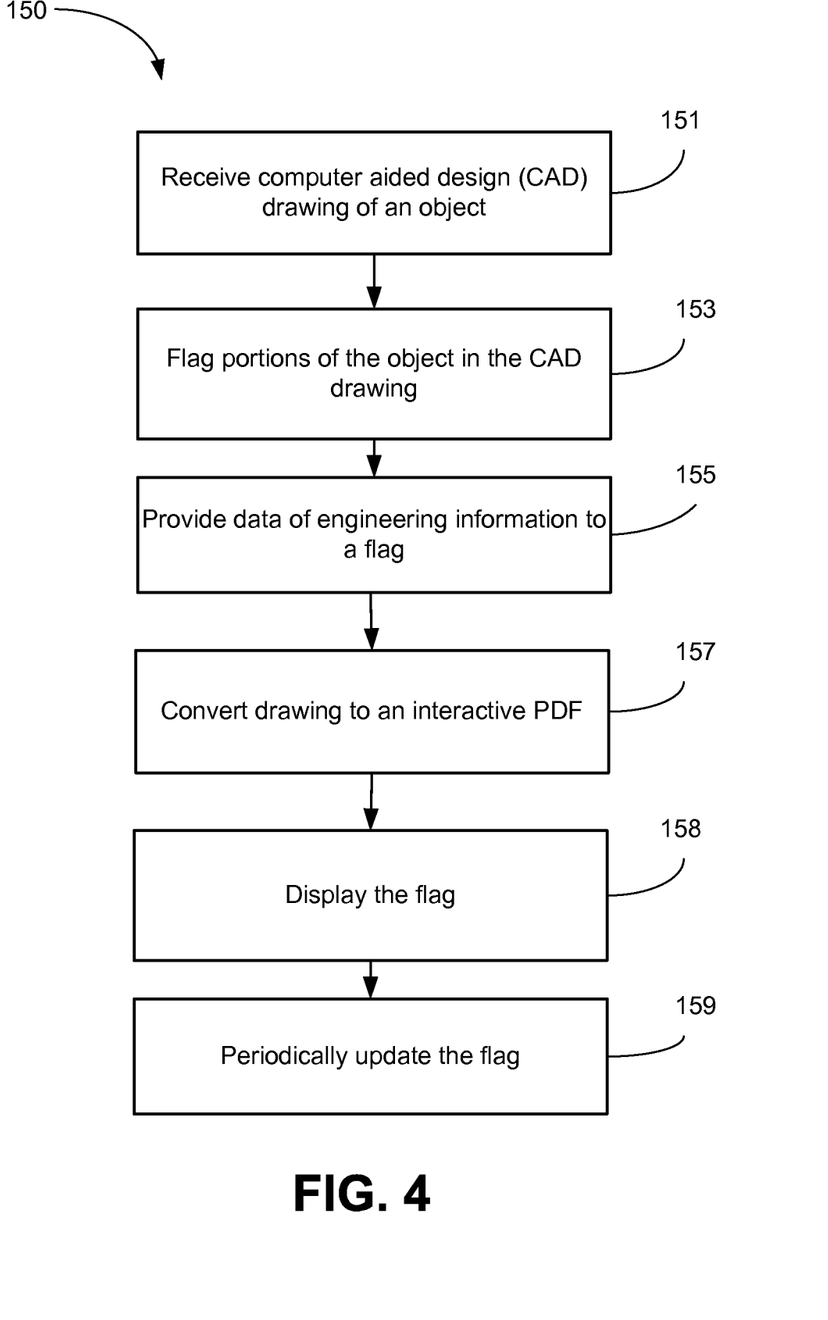
FIG. 4 illustrates an exemplary method for an interactive 3D model with markers to indicate engineering requirements.

FIG. 4 illustrates an exemplary method 150 for an interactive 3D model with markers to indicate engineering requirements. At block 151, engineering drawing 100 with object 101 may be received. Engineering drawing 100 can be a 3D CAD drawing that is able to be manipulated in 3D space. For example, engineering drawing 100 may be turned to show different perspectives as well as zoom in or out. Engineering drawing 100 may be created using any available application, program, or software useable to create or view an engineering drawing. Such drafting applications include CAD applications such as AutoCad®, Microstation®, and SolidWorks®, among others. At block 153, portions of object 101 are flagged based on data associated with engineering requirements for object 100. Flag 103 as well as the other flags may be 3D. At block 155, engineering requirement data is provided to flag 103 of engineering drawing 100. The engineering requirement data for the flag may be text or type searchable. For example, a search may be done for a flag that is a type "critical link." The critical link flags may be highlighted or otherwise distinguished when the engineering drawing 100 is displayed.

At block 157, a CAD drawing of engineering drawing 100 may be converted into a 3D PDF engineering drawing. The 3D PDF of engineering drawing 100 may be in a variety of standard formats, such as the Product Representation Compact (PRC-ISO 14739-1) and Universal 3D (U3D ECMA-363) formats. At block 158, flag 103 and the engineering drawing 100 can be displayed on tablet 146 (FIG. 3) in the 3D PDF format. Engineering requirement data associated with flag 103 (and other flags) may be viewed after receiving an indication, such as a mouse-click, keyboard, or finger touch (e.g., touch-sensitive display) at a particular point on flag 103 in the engineering drawing 100, which may indicate a user's desire for viewing the contents of the selected flag (e.g., flag 103). At block 159, flag 103 of engineering drawing 100 may be automatically updated based on periodic updates of the engineering requirement data. If a change is required to the engineering definition, the 3D model is updated in the CAD system. When this change is approved through an organization's change management process, the revised 3D model becomes the current approved definition. This can be the trigger for the generation of a new 3D PDF (e.g., engineering drawing 100) that is derived from the newly revised 3D model.

As discussed herein, flags may be substantially updated in an automated way as compared to conventional methods of preparing and updating engineering drawings. The methods, systems, and devices herein may be used for engineering drawings applied in a variety of areas, such as wiring installations, manufacturing of devices, or building bridges, among other things.

Figure 5:
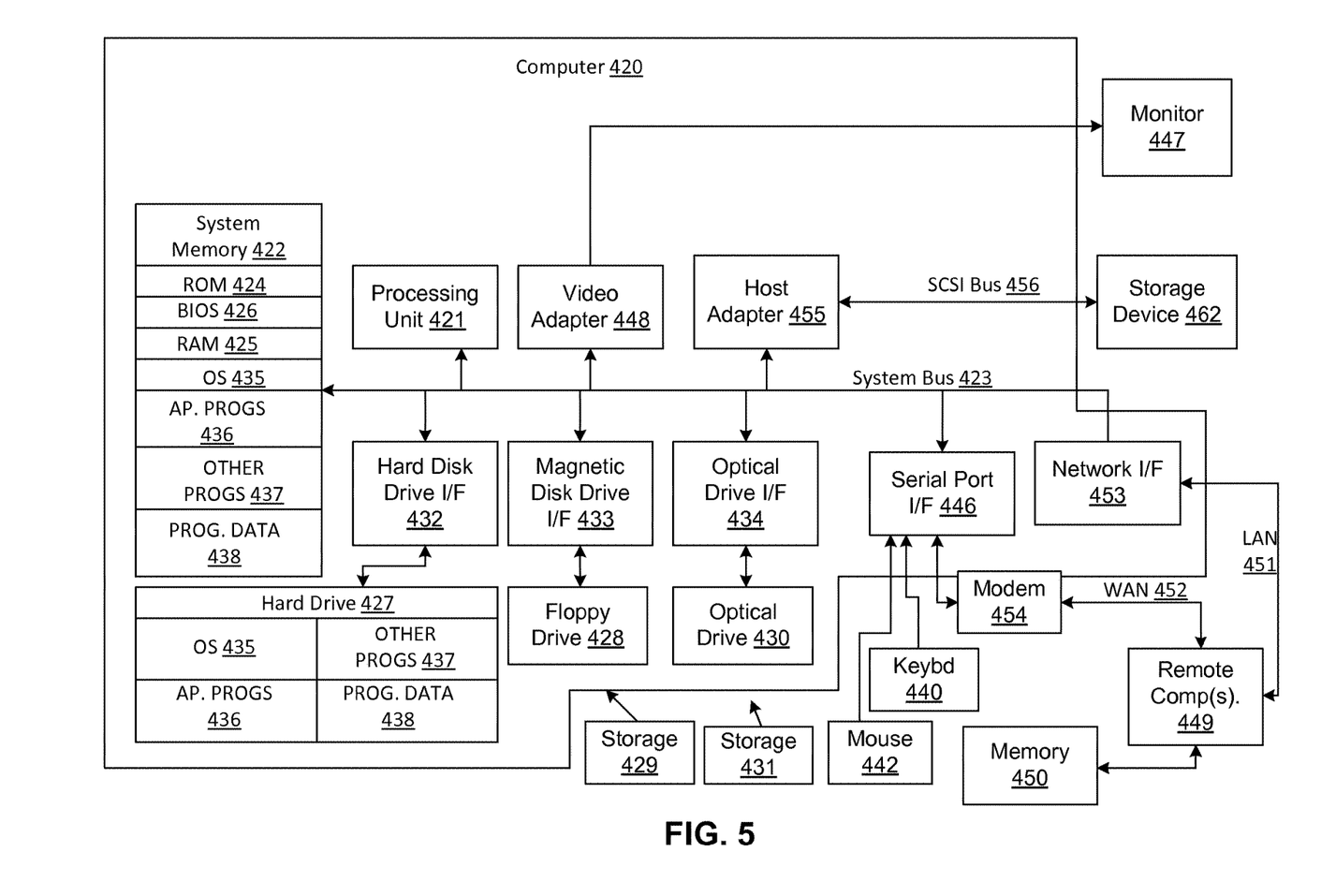
FIG. 5 is an example block diagram representing a general purpose computer system in which aspects of the methods and systems disclosed herein or portions thereof may be incorporated.

FIG. 5 and the following discussion are intended to provide a brief general description of a suitable computing environment in which the methods and systems disclosed herein and/or portions thereof may be implemented. Although not required, the methods and systems disclosed herein is described in the general context of computer-executable instructions, such as program modules, being executed by a computer, such as a client workstation, server, personal computer, or mobile computing device such as a smartphone. Generally, program modules include routines, programs, objects, components, data structures and the like that perform particular tasks or implement particular abstract data types. Moreover, it should be appreciated the methods and systems disclosed herein and/or portions thereof may be practiced with other computer system configurations, including hand-held devices, multi-processor systems, microprocessor-based or programmable consumer electronics, network PCs, minicomputers, mainframe computers and the like. A processor may be implemented on a single-chip, multiple chips or multiple electrical components with different architectures. The methods and systems disclosed herein may also be practiced in distributed computing environments where tasks are performed by remote processing devices that are linked through a communications network. In a distributed computing environment, program modules may be located in both local and remote memory storage devices.

FIG. 5 is a block diagram representing a general purpose computer system in which aspects of the methods and systems disclosed herein and/or portions thereof may be incorporated. For example, FIG. 3 and disclosed devices, such as database 142, server 144, and tablet 146. As shown, the example general purpose computing system includes a computer 420 or the like, including a processing unit 421, a system memory 422, and a system bus 423 that couples various system components including the system memory to the processing unit 421. The system bus 423 may be any of several types of bus structures including a memory bus or memory controller, a peripheral bus, and a local bus using any of a variety of bus architectures. The system memory includes read-only memory (ROM) 424 and random access memory (RAM) 425. A basic input/output system 426 (BIOS), containing the basic routines that help to transfer information between elements within the computer 420, such as during start-up, is stored in ROM 424.

The computer 420 may further include a hard disk drive 427 for reading from and writing to a hard disk (not shown), a magnetic disk drive 428 for reading from or writing to a removable magnetic disk 429, and an optical disk drive 430 for reading from or writing to a removable optical disk 431 such as a CD-ROM or other optical media. The hard disk drive 427, magnetic disk drive 428, and optical disk drive 430 are connected to the system bus 423 by a hard disk drive interface 432, a magnetic disk drive interface 433, and an optical drive interface 434, respectively. The drives and their associated computer-readable media provide non-volatile storage of computer readable instructions, data structures, program modules and other data for the computer 420. As described herein, computer-readable media is a tangible, physical, and concrete article of manufacture and thus not a signal per se.

Although the example environment described herein employs a hard disk, a removable magnetic disk 429, and a removable optical disk 431, it should be appreciated that other types of computer readable media which can store data that is accessible by a computer may also be used in the example operating environment. Such other types of media include, but are not limited to, a magnetic cassette, a flash memory card, a digital video or versatile disk, a Bernoulli cartridge, a random access memory (RAM), a read-only memory (ROM), and the like.

A number of program modules may be stored on the hard disk, magnetic disk 429, optical disk 431, ROM 424 or RAM 425, including an operating system 435, one or more application programs 436, other program modules 437 and program data 438. A user may enter commands and information into the computer 420 through input devices such as a keyboard 440 and pointing device 442. Other input devices (not shown) may include a microphone, joystick, game pad, satellite disk, scanner, or the like. These and other input devices are often connected to the processing unit 421 through a serial port interface 446 that is coupled to the system bus, but may be connected by other interfaces, such as a parallel port, game port, or universal serial bus (USB). A monitor 447 or other type of display device is also connected to the system bus 423 via an interface, such as a video adapter 448. In addition to the monitor 447, a computer may include other peripheral output devices (not shown), such as speakers and printers. The example system of FIG. 5 also includes a host adapter 455, a Small Computer System Interface (SCSI) bus 456, and an external storage device 462 connected to the SCSI bus 456.

The computer 420 may operate in a networked environment using logical connections to one or more remote computers, such as a remote computer 449. The remote computer 449 may be a personal computer, a server, a router, a network PC, a peer device or other common network node, and may include many or all of the elements described above relative to the computer 420, although only a memory storage device 450 has been illustrated in FIG. 5. The logical connections depicted in FIG. 5 include a local area network (LAN) 451 and a wide area network (WAN) 452. Such networking environments are commonplace in offices, enterprise-wide computer networks, intranets, and the Internet.

When used in a LAN networking environment, the computer 420 is connected to the LAN 451 through a network interface or adapter 453. When used in a WAN networking environment, the computer 420 may include a modem 454 or other means for establishing communications over the wide area network 452, such as the Internet. The modem 454, which may be internal or external, is connected to the system bus 423 via the serial port interface 446. In a networked environment, program modules depicted relative to the computer 420, or portions thereof, may be stored in the remote memory storage device. It will be appreciated that the network connections shown are example and other means of establishing a communications link between the computers may be used.

Computer 420 may include a variety of computer readable storage media. Computer readable storage media can be any available media that can be accessed by computer 420 and includes both volatile and nonvolatile media, removable and non-removable media. By way of example, and not limitation, computer readable media may comprise computer storage media and communication media. Computer storage media include volatile and nonvolatile, removable and non-removable media implemented in any method or technology for storage of information such as computer readable instructions, data structures, program modules or other data. Computer storage media include, but are not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computer 420. Combinations of any of the above should also be included within the scope of computer readable media that may be used to store source code for implementing the methods and systems described herein. Any combination of the features or elements disclosed herein may be used in one or more examples.

In describing preferred examples of the subject matter of the present disclosure, as illustrated in the FIG.'s, specific terminology is employed for the sake of clarity. The claimed subject matter, however, is not intended to be limited to the specific terminology so selected, and it is to be understood that each specific element includes all technical equivalents that operate in a similar manner to accomplish a similar purpose. The communications paths described herein may be wired or wireless. The systems and subsystems discussed herein may be distributed or integrated into one device.

This written description uses examples to disclose the invention, including the best mode, and also to enable any person skilled in the art to practice the invention, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed:

1. A method for configuring a user interface, the method comprising:
   displaying, by a display device, a graphical user interface including an object in a three-dimensional (3D) space;
   receiving first data, the first data comprising a link between a 3D flag and a component of the object, the 3D flag indicative of an engineering requirement associated with the component of the object and linked to an electronic depository of design data of a computer aided design (CAD) program;
   responsive to receiving the first data, displaying the 3D flag in the 3D space approximate to the component of the object;
   rotating the object to a perspective that conceals the component from displaying; and tracking the rotating of the object and providing instructions to not display the 3D flag based on determining that the component is concealed from displaying.

2. The method of claim 1, further comprising:
   receiving second data including a message from the graphical user interface indicative of a selection of the 3D flag; and
   responsive to receiving the second data, displaying information about the 3D flag.

3. The method of claim 2, wherein the displaying of information about the 3D flag comprises text that is indicative of wiring requirements associated with the component of the object.

4. The method of claim 2, wherein the displaying of information about the 3D flag comprises video media of the engineering requirement associated with the component of the object.

5. The method of claim 2, wherein the displaying of information about the 3D flag comprises text or audio of the engineering requirement associated with the component of the object.

6. The method of claim 1, wherein third data associated with the engineering requirement is searchable based on a type of the 3D flag.

7. The method of claim 1, wherein the displaying the 3D flag in the 3D space approximate to the component of the object is done using a 3D portable document format.

8. The method of claim 1, wherein the 3D flag is automatically generated by CAD program.

9. A system comprising:
   a display;
   a processor communicatively connected with the display; and
   a memory coupled with the processor, the memory having stored thereon executable instructions that when executed by the processor cause the processor to effectuate operations comprising:
   providing instructions to display a graphical user interface including an object in a three-dimensional (3D) space;
   receiving first data, the first data comprising a link between a 3D flag and a component of the object, the 3D flag indicative of an engineering requirement associated with the component of the object and linked to an electronic depository of design data of a computer aided design (CAD) program;
   responsive to receiving the first data, providing instructions to display the 3D flag in the 3D space approximate to the component of the object;
   rotating the object to a perspective that conceals the component from displaying; and providing instructions to not display the 3D flag in response to determining that the perspective conceals the component from displaying.

10. The system of claim 9, wherein the memory further comprises instructions that when executed by the processor cause the processor to effectuate operations comprising:
    receiving second data including a message from the graphical user interface indicative of a selection of the 3D flag; and
    responsive to receiving the second data, displaying information about the 3D flag.

11. The system of claim 10, wherein the displaying of information about the 3D flag comprises text that is indicative of wiring requirements associated with the component of the object.

12. The system of claim 10, wherein the displaying of information about the 3D flag comprises video media of the engineering requirement associated with the component of the object.

13. The system of claim 10, wherein the displaying of information about the 3D flag comprises text or audio of the engineering requirement associated with the component of the object.

14. The system of claim 9, wherein the displaying the 3D flag in the 3D space approximate to the component of the object is done using a 3D portable document format.

15. A device comprising:
    a processor; and
    a memory coupled with the processor, the memory having stored thereon executable instructions that when executed by the processor cause the processor to effectuate operations comprising:
    providing instructions to display a graphical user interface including an object in a three-dimensional (3D) space;
    receiving first data, the first data comprising a link between a 3D flag and a component of the object, the 3D flag indicative of an engineering requirement associated with the component of the object and linked to an electronic depository of design data of a computer aided design (CAD) program;
    responsive to receiving the first data, providing instructions to display the 3D flag in the 3D space approximate to the component of the object;
    rotating the object to a perspective that conceals the component from displaying; and
    preventing display of the 3D flag when the component is concealed from displaying.

16. The device of claim 15, wherein the memory further comprises instructions that when executed by the processor cause the processor to effectuate operations comprising:
    receiving second data including a message from the graphical user interface indicative of a selection of the 3D flag; and
    responsive to receiving the second data, displaying information about the 3D flag.

17. The device of claim 16, wherein the displaying of information about the 3D flag comprises text that is indicative of wiring requirements associated with the component of the object.

18. The device of claim 16, wherein the displaying of information about the 3D flag comprises video media of the engineering requirement associated with the component of the object.

19. The device of claim 16, wherein the displaying of information about the 3D flag comprises text or audio of the engineering requirement associated with the component of the object.

20. The device of claim 15, wherein third data associated with the engineering requirement is searchable based on a type of the 3D flag.

* * * * *